United States Patent
Harada

(10) Patent No.: US 8,648,603 B2
(45) Date of Patent: Feb. 11, 2014

(54) DETERIORATION DEGREE CALCULATING APPARATUS FOR SECONDARY BATTERY, VEHICLE EQUIPPED WITH THE APPARATUS, AND DETERIORATION DEGREE CALCULATING METHOD FOR SECONDARY BATTERY

(75) Inventor: Hironori Harada, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/056,995

(22) PCT Filed: Apr. 21, 2010

(86) PCT No.: PCT/JP2010/057029
§ 371 (c)(1),
(2), (4) Date: Feb. 1, 2011

(87) PCT Pub. No.: WO2011/132268
PCT Pub. Date: Oct. 27, 2011

(65) Prior Publication Data
US 2013/0038333 A1   Feb. 14, 2013

(51) Int. Cl.
G01N 27/416   (2006.01)

(52) U.S. Cl.
USPC ............................ 324/431; 324/425; 324/430

(58) Field of Classification Search
None
See application file for complete search history.

(56) References Cited

U.S. PATENT DOCUMENTS

| 6,366,054 | B1 * | 4/2002 | Hoenig et al. | 320/132 |
| 2008/0204031 | A1 * | 8/2008 | Iwane et al. | 324/430 |
| 2010/0256935 | A1 | 10/2010 | Imanishi et al. | |

FOREIGN PATENT DOCUMENTS

| JP | 7-128416 | 5/1995 |
| JP | 8-213059 | 8/1996 |
| JP | 9-129267 | 5/1997 |
| JP | 10-164764 | 6/1998 |
| JP | 11-150878 | 6/1999 |
| JP | 2004-191175 | 7/2004 |
| JP | 2005-130559 | 5/2005 |
| JP | 2009-80104 | 4/2009 |
| JP | 2009-128250 | 6/2009 |

* cited by examiner

Primary Examiner — Melissa Koval
Assistant Examiner — Courtney McDonnough
(74) Attorney, Agent, or Firm — Finnegan, Henderson, Farabow, Garrett & Dunner, L.L.P.

(57) ABSTRACT

A deterioration degree calculating apparatus for a secondary battery of the invention includes: obtaining a voltage value at a stop time of charge and discharge of a target secondary battery; obtaining a voltage value at a first start time of charge and discharge after that; obtaining an SOC of the target secondary battery at the stop time or at the start time; obtaining a length of an unused period from the stop time to the start time (an elapsed time); obtaining a self-discharge slope of the target secondary battery by dividing an absolute value of a difference between the voltage value at the start time and the voltage value at the stop time by the elapsed time; obtaining a temperature during an unused period by use of a self-discharge map in which the SOC and the self-discharge slope is recorded for each temperature; calculating a progress degree of deterioration of the target secondary battery during the unused period based on the obtained temperature and elapsed time; and accumulating the calculated deterioration progress degree to accurately calculate the deterioration degree of the secondary battery without continuously consuming electric power during the unused period.

2 Claims, 9 Drawing Sheets

US 8,648,603 B2

DETERIORATION DEGREE CALCULATING APPARATUS FOR SECONDARY BATTERY, VEHICLE EQUIPPED WITH THE APPARATUS, AND DETERIORATION DEGREE CALCULATING METHOD FOR SECONDARY BATTERY

CROSS-REFERENCE TO RELATED APPLICATIONS

This is a national phase application based on the PCT International Patent Application No. PCT/JP2010/057029 filed on Apr. 21, 2010, the entire contents of which are incorporated herein by reference.

TECHNICAL FIELD

The present invention relates to a deterioration degree calculating apparatus for a secondary battery arranged to calculate a degree of progress of deterioration of the secondary battery mounted in a vehicle and its method, and a vehicle equipped with the apparatus. More particularly, the present invention relates to a deterioration degree calculating apparatus for a secondary battery arranged to calculate the degree of progress of deterioration of the secondary battery during a vehicle parking period and utilizing a calculation result to obtain a remaining life of a battery and set subsequent use conditions, a vehicle equipped with the apparatus and a deterioration degree calculating method for a secondary battery.

BACKGROUND ART

Secondary batteries such as a lithium ion secondary battery have been known as gradually deteriorating, thereby decreasing a battery capacity, due to repeated charge and discharge or even simple nonuse. Accordingly, there is heretofore disclosed a technique for ascertaining the degree of deterioration of a secondary battery and estimating a remaining battery life (see Patent Literature 1, for example).

For instance, a secondary battery mounted in a privately owned vehicle is often left unused for a longer period in the entire life, i.e., during vehicle parking, than in a charging/discharging state, i.e., during vehicle running. Accordingly, the battery life greatly results from the degree of progress of deterioration in an unused state. It is found that the progress of deterioration in the unused state largely depends on the temperatures during the unused period. Therefore, the temperature of a battery is conventionally measured (see Patent Literature 2, for example). A configuration for measuring the temperature of a battery appears as a temperature sensor in Patent Literature 1 and a built-in thermistor in Patent Literature 2.

Citation List

Patent Literature

Patent Literature 1: JP 2009-80104A
Patent Literature 2: JP 11 (1999)-150878A

SUMMARY OF INVENTION

Technical Problem

However, the aforementioned conventional technique has the following disadvantages. In the case of measuring the temperature of a battery, normally, a temperature sensor or the like is placed outside a cell to measure the temperature of an outer case of the battery for example at several positions. It is therefore impossible to accurately measure the temperature of the inside of the battery. Further, an in-vehicle computer has to be turned ON in order to detect the temperature by use of the temperature sensor such as the thermistor and a thermo couple. Accordingly, it is necessary to supply electric power from the battery to the in-vehicle computer. Even for the purpose of ascertaining the degree of deterioration of a battery to calculate the remaining battery life, it is not preferable to continuously supply electric power from the battery even during a vehicle parking period.

The present invention has been made to solve the above problems of the conventional technique and has a purpose to provide a deterioration degree calculating apparatus for a secondary battery, capable of accurately calculating the degree of deterioration of the secondary battery without continuously consuming electric power during an unused period, and a vehicle equipped with the apparatus, and a deterioration degree calculating method for a secondary battery.

Solution to Problem

To achieve the above purpose, one aspect of the invention provides a secondary battery deterioration degree calculating apparatus comprising: a stop-time voltage obtaining section for obtaining a voltage value at a point of time when charge and discharge of a target secondary battery is terminated; a start-time voltage obtaining section for obtaining a voltage value at a point of time when charge and discharge of the target secondary battery is started for the first time after the stop-time voltage obtaining section obtains data; an SOC obtaining section for obtaining an SOC of the target secondary battery at a stop time or at a start time; a time obtaining section for obtaining a length of time (hereinafter, referred to as "elapsed time") from when the stop-time voltage obtaining section obtains the data to when the start-time voltage obtaining section obtains data (hereinafter, referred to as "unused period"); a self-discharge slope obtaining section for obtaining a self-discharge slope of the target secondary battery by dividing an absolute value of a difference between the start-time voltage value obtained by the start-time voltage obtaining section and the stop-time voltage value obtained by the stop-time voltage obtaining section by the elapsed time obtained by the time obtaining section; a self-discharge map in which a relationship between an SOC and the self-discharge slope in the target secondary battery is recorded for each temperature; a temperature determining section for obtaining a temperature from the self-discharge slope obtained by the self-discharge slope obtaining section, the SOC obtained by the SOC obtaining section, and the self-discharge map; a deterioration degree calculating section for calculating a progress degree of deterioration of the target secondary battery during the unused period based on the temperature obtained by the temperature determining section and the elapsed time obtained by the time obtaining section; and a deterioration degree accumulating section for accumulating the progress degree of deterioration calculated by the deterioration degree calculating section.

The deterioration degree calculating apparatus for a secondary battery in the above configuration is arranged to obtain the voltage value at the point of time when charge and discharge of the target secondary battery is terminated and the voltage value at the point of time when charge and discharge is started for the first time after that, divide the difference between them by the elapsed time between them to obtain the self-discharge slope. Specifically, the progress degree of the self-discharge during a period in which the battery is left unused can be obtained. Further, it is arranged to obtain the SOC at the stop time or at the start time. By referring to this SOC, the calculated self-discharge slope, and the self-discharge map, an average temperature during the unused period can be obtained. During the unused period, any process such as temperature measurement does not need to be performed. Accordingly, no electric power is consumed during the unused period. Further, the progress degree of deterioration during the unused period can be calculated by use of the thus obtained temperature. Accumulating the calculated progress degree enables accurate calculation of the degree of deterioration of the battery.

Further, another aspect of the invention provides a vehicle quipped with the aforementioned secondary battery deterioration degree calculating apparatus.

Further, another aspect of the invention provides a deterioration degree calculating method for a secondary battery, the method comprising the steps of: obtaining a voltage value at a point of time when charge and discharge of a target secondary battery is terminated (hereinafter, referred to as "stop time"); obtaining a voltage value at a point of time when the charge and discharge of the target secondary battery is started (hereinafter, referred to as "start time") for a first time after the voltage value at the stop time is obtained; obtaining an SOC of the target secondary battery at the stop time or at the start time; obtaining a length of time from the stop time to the start time (hereinafter, referred to as "elapsed time"); obtaining a self-discharge slope of the target secondary battery by dividing an absolute value of a difference between the voltage value obtained at the start time and the voltage value obtained at the stop time by the obtained elapsed time; obtaining a temperature from the obtained self-discharge slope, the obtained SOC, and the self-discharge map by use of the self-discharge map in which a relationship between an SOC and a self-discharge slope in the target secondary battery is recorded for each temperature; calculating a progress degree of deterioration of the target secondary battery during an unused period based on the obtained temperature and the obtained elapsed time; and accumulating the calculated progress degree of deterioration.

Advantageous Effects of Invention

According to the deterioration degree calculating apparatus for a secondary battery, the vehicle equipped with the apparatus, and the deterioration degree calculating method for a secondary battery in the aforementioned configurations, it is possible to accurately calculate the degree of deterioration of a secondary battery without continuously consuming electric power during an unused period.

DESCRIPTION OF EMBODIMENTS

A detailed description of a preferred embodiment of the present invention will now be given referring to the accompanying drawings. This embodiment is a secondary battery mounted in a car and a deterioration degree calculating apparatus for calculating a deterioration degree of the secondary battery.

Figure 1:
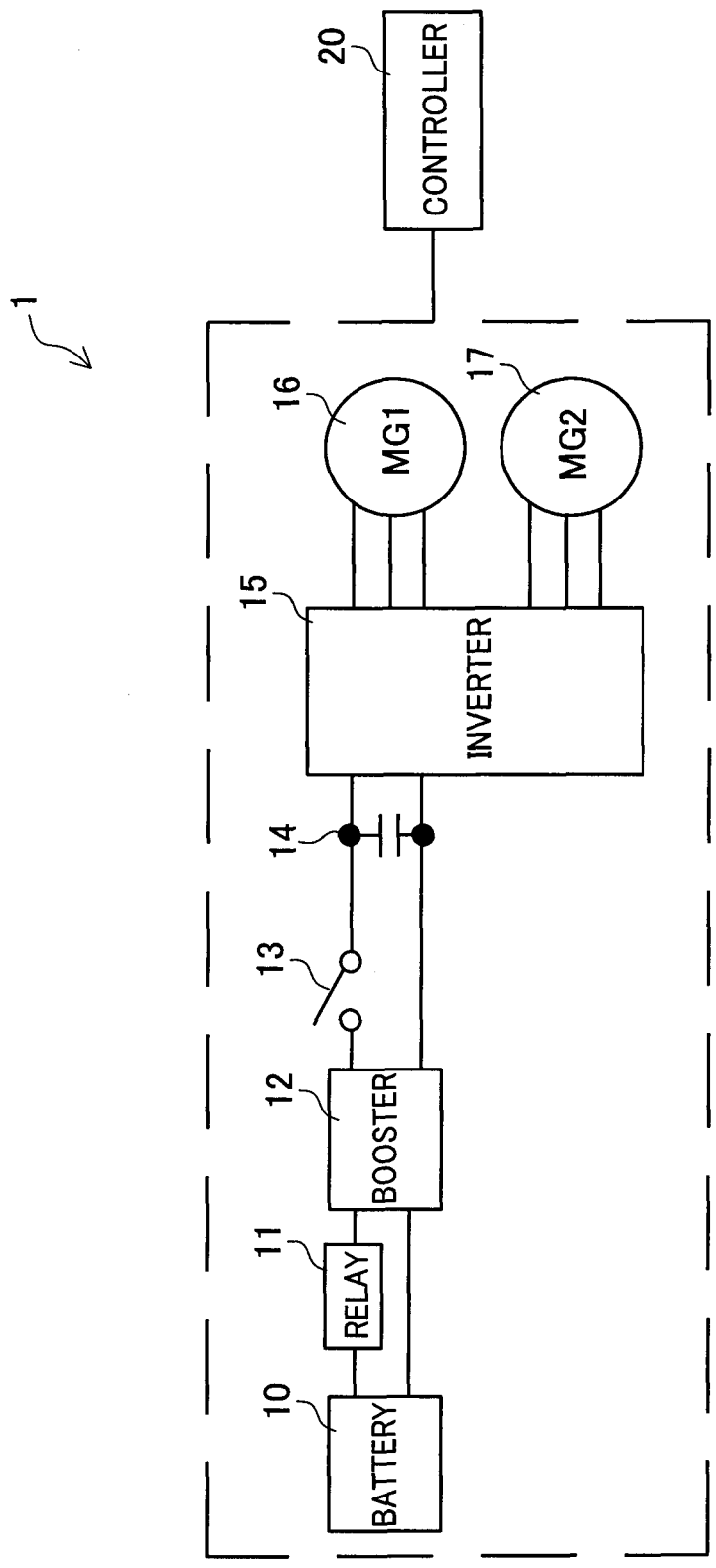
FIG. 1 is a block diagram showing a schematic configuration of deterioration degree calculating apparatus for a secondary battery in an embodiment.

A secondary battery deterioration degree calculating apparatus (a "calculating apparatus") 1 in this embodiment is to control and use a battery 10 as shown in FIG. 1. In this embodiment, the calculating apparatus 1 is mounted in a vehicle such as a car and placed in its vehicle body. A battery 10 used in this embodiment is a lithium ion secondary battery. This battery 10 is configured in the form of a battery pack including a plurality of cells connected to one another for supplying large electric power.

The calculating apparatus 1 in this embodiment includes, as schematically shown in FIG. 1, a relay 11, a booster 12, a switch 13, a condenser 14, an inverter 15, a first MG (motor generator) 16, and a second MG 17. These are components generally used in a hybrid vehicle and others. In this embodiment, furthermore, a controller 20 is also provided to control all of them. The controller 20 operates upon receipt of electric power from the battery 10. The controller 20 determines a degree of deterioration of the battery 10 and sets charge/discharge conditions and others of the battery 10 to control charging and discharging.

The switch 13 is to be operated by a user through a starter key for a vehicle or the like. The battery 10 is not charged nor discharged while the switch 13 is in an OFF state. In other words, at the time when the switch 13 is turned OFF by the user, charging/discharging of the battery 10 is stopped. This corresponds to a stop time. Hereinafter, this point of time is referred to as a stop time. After the stop time, at the time when the switch 13 is turned ON, charging/discharging of the battery 10 is started. This corresponds to a start time. This point of time is referred to as a start time.

For a period from a stop time to the next start time, charging/discharging of the battery 10 is not performed. Hereinafter, this period is referred to as an unused period. During this unused period, the function of the controller 20 is also deactivated and the vehicle is in a parking state. The controller 20 when activated appropriately obtains temperature and voltage value of the battery 10, current value during charge/discharge, etc. However, the controller 20 cannot obtain such information during the unused period. On the other hand, deterioration of the battery 10 progresses while being charged and discharged during vehicle running and others and also while being not charged and discharged during the unused period. The controller 20 in this embodiment therefore calculates the progress degree of deterioration during the unused period when shifted from the unused period to the start time.

In the present embodiment, the temperature of the battery 10 during the unused period is calculated. This is because the progress degree of deterioration of the battery 10 in the unused state has a temperature dependency and the information on the temperature is needed for calculation of the deterioration degree. In this embodiment, the temperature of the battery 10 is calculated, not measured, during the unused period. The status information of the battery 10 at the stop time and at the start time which are before and after the unused period is obtained respectively. Based on the information, the temperature for the period is calculated.

During the unused period, an electric current path is broken but the battery 10 discharges to a certain degree by itself. This is referred to as self-discharge. The progress degree of this self-discharge varies according to an SOC of the battery 10 at the stop time and the temperature of the battery 10 during the unused period and others. It is to be noted that SOC (State of Charge) represents a charging ratio of a battery capacity of the battery 10 at the time.

The controller 20 in this embodiment is arranged to calculate the temperature for the unused period based on the progress degree of self-discharge. Thus, variations in temperature of the battery 10 during unused period are not obtained but only an average temperature through the whole period is obtained. This is sufficient to calculate the deterioration degree of the battery 10 during the unused period. Specifically, the degree at which the battery 10 deteriorates during that unused period is calculated accurately based on the average temperature during the unused period.

Figure 2:
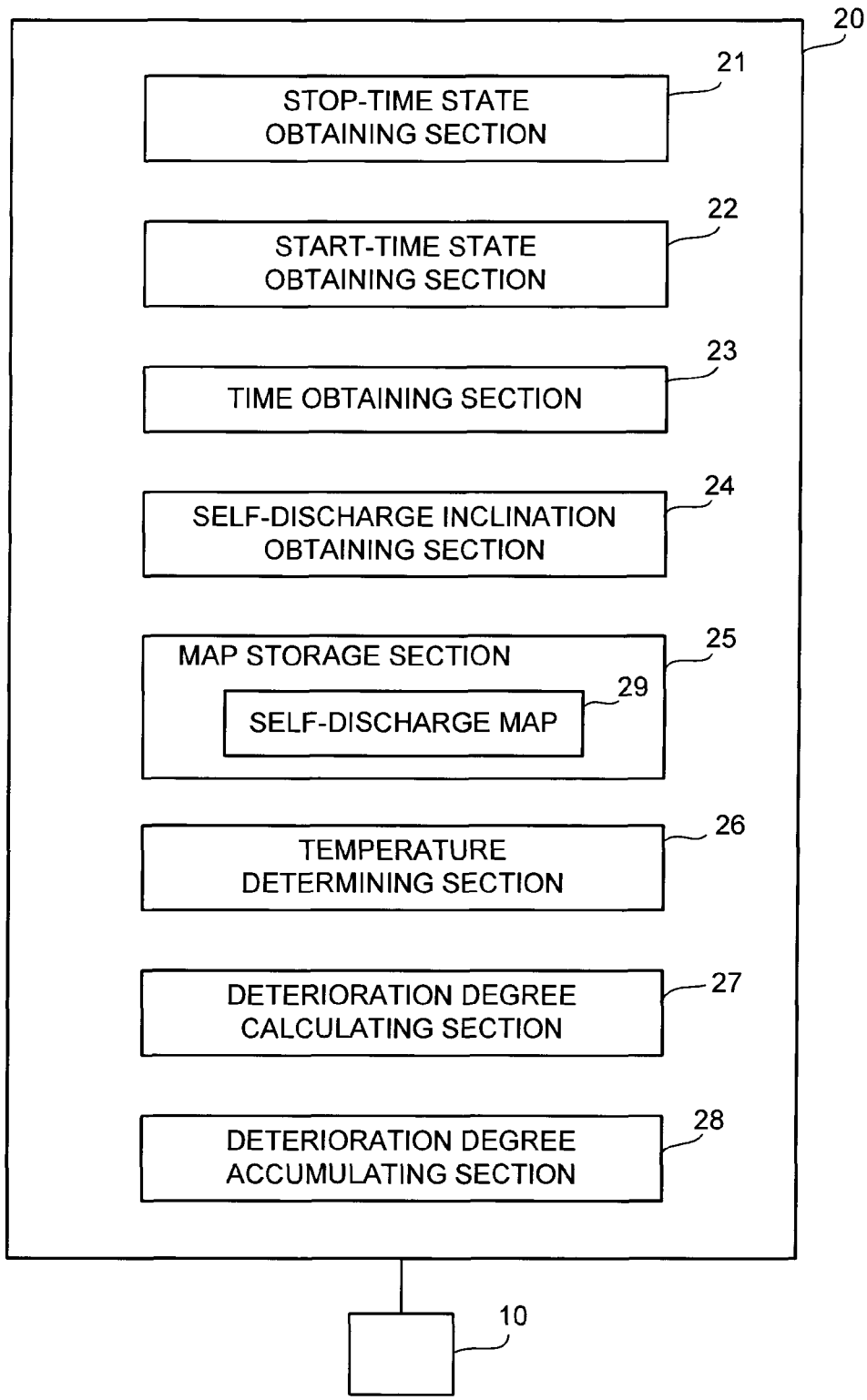
FIG. 2 is a block diagram showing a controller in the embodiment.

Accordingly, the controller 20 in this embodiment includes, as shown in FIG. 2, a stop-time state obtaining section 21, a start-time state obtaining section 22, a time obtaining section 23, a self-discharge slope obtaining section 24, a map storage section 25, a temperature determining section 26, a deterioration degree calculating section 27, and a deterioration degree accumulating section 28. Further, the map storage section 25 stores a self-discharge map 29. The stop-time state obtaining section 21 is configured to obtain the state of the battery 10 at the stop time and, in particular, obtain a voltage value and an SOC of the battery 10 at the stop time. In the present embodiment, the SOC at the stop time is used for temperature calculation and hence the stop-time state obtaining section 21 is used as both a stop-time voltage obtaining section and an SOC obtaining section.

The start-time state obtaining section 22 is arranged to obtain the state of the battery 10 at the start time and, in particular, obtains a voltage value of the battery 10 at the start time. The start-time state obtaining section 22 functions as a start-time voltage obtaining section. At the start time, the time obtaining section 23 obtains an elapsed time from the last stop time preceding the start time. This elapsed time is a time during which the battery 10 has been left unused. The self-discharge slope obtaining section 24 is arranged to calculate the self-discharge slope R mentioned later. The self-discharge map 29 stored in the map storage section 25 includes a graph (see FIG. 4) prepared for each temperature by plotting the self-discharge slope R obtained by the self-discharge slope obtaining section 24 in association with the SOC of the battery 10 at the stop time.

The temperature determining section 26 is arranged to calculate a temperature for the unused period by referring to the self-discharge map 29. The deterioration degree calculating section 27 is configured to calculate a deterioration degree during this unused period by using the temperature T estimated from the self-discharge map 29. The deterioration degree accumulating section 28 is arranged to accumulate the deterioration degrees calculated by the deterioration degree calculating section 27 and obtain a deterioration degree up to the present time.

Figure 3:
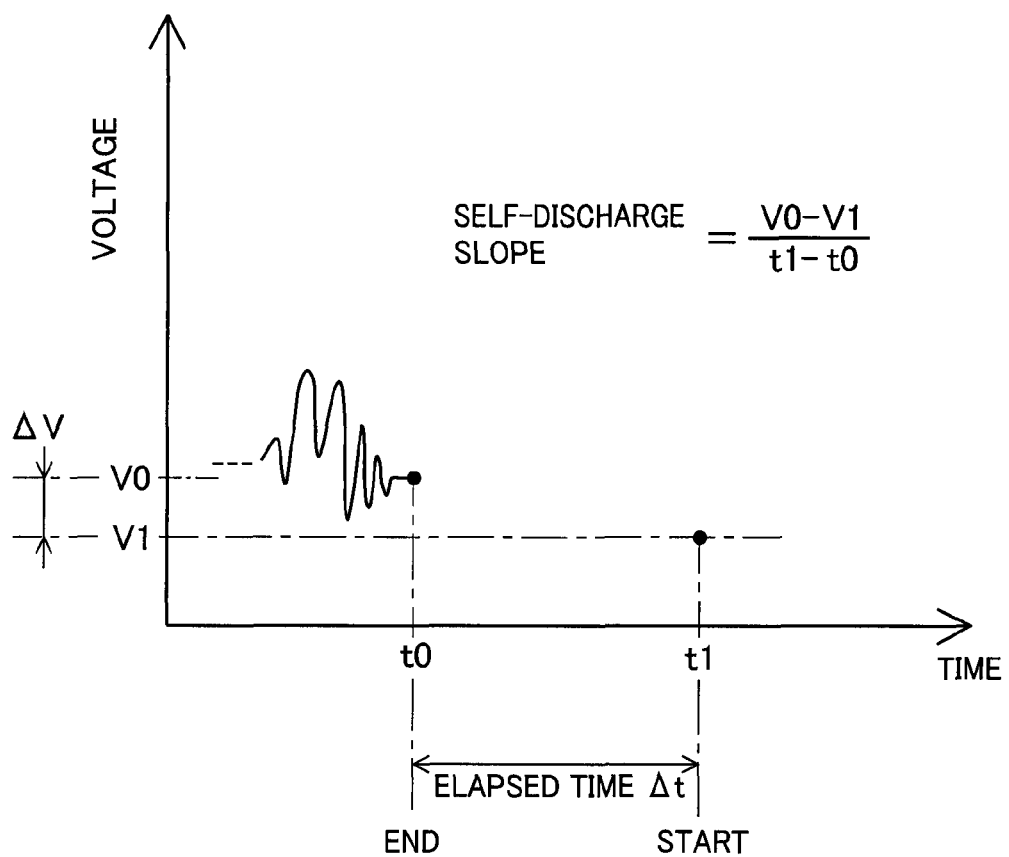
FIG. 3 is a graph showing a relationship between time and battery voltage.

The self-discharge slope R is explained below. The self-discharge slope R responds to the speed at which the self-discharge advances during the unused period. As shown in FIG. 3, when the voltage of the battery 10 obtained at a stop time t0 by the stop-time state obtaining section 21 is referred to as a stop-time voltage V0 and the voltage of the battery 10 obtained at a start time t1 by the start-time state obtaining section 22 is referred to as a start-time voltage V1, a difference between them corresponds to a loss of voltage caused by the self-discharge during the unused period. Thus, a self-discharge quantity per unit of time is calculated by the following equation (I) throughout this whole period. This is referred to as the self-discharge slope R.

Specifically, as shown in FIG. 3, the self-discharge slope R is calculated by the following equation (I) based on a voltage difference $\Delta V$ between before and after the unused period, which is a difference between the stop-time voltage V0 and the start-time voltage V1, and an elapsed time $\Delta t$ obtained by the time obtaining section 23:

$$R = \Delta V / \Delta t \qquad (I)$$
$$= (V0 - V1)/(t1 - t0)$$

where t0 represents the stop time and t1 represents the start time.

Figure 4:
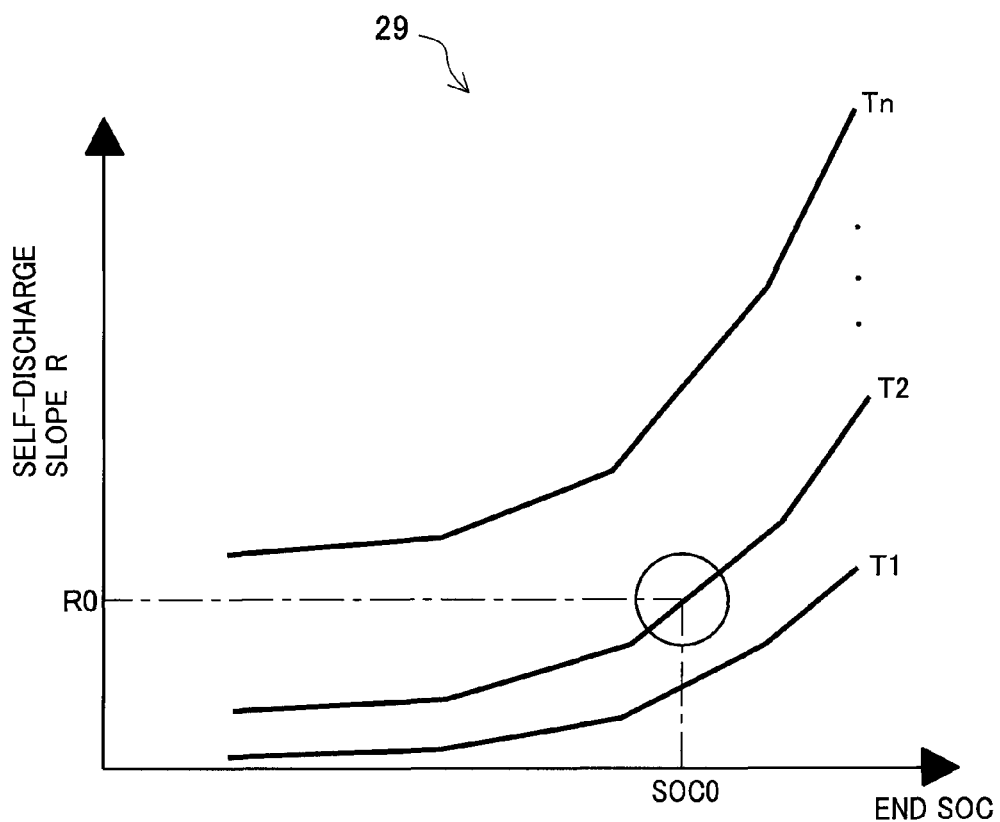
FIG. 4 is a map showing a relationship between SOC and self-discharge slope.

The present embodiment includes the self-discharge map 29 storing, for each temperature T, the relationship between the self-discharge slope R obtained by the equation (I) and the stop-time SOC obtained by the stop-time state obtaining section 21 as shown in FIG. 4. This self-discharge map 29 is prepared in advance to suit the type of the battery 10 and is stored in the controller 20. This process is performed on board by the controller 20 in each vehicle. There is no need to take out the battery 10 from the vehicle or use any external test devices.

By referring to the self-discharge map 29, therefore, the temperature T can be read based on the self-discharge slope R and the stop-time SOC as shown in FIG. 4. For instance, if the self-discharge slope R is R0 and the stop-time SOC is SOC0, the temperature T during the unused period is calculated as T2 as indicated by a circle in the figure. This figure merely shows several typical temperatures, but it is more preferable that an actual map includes more number of data.

Figure 5:
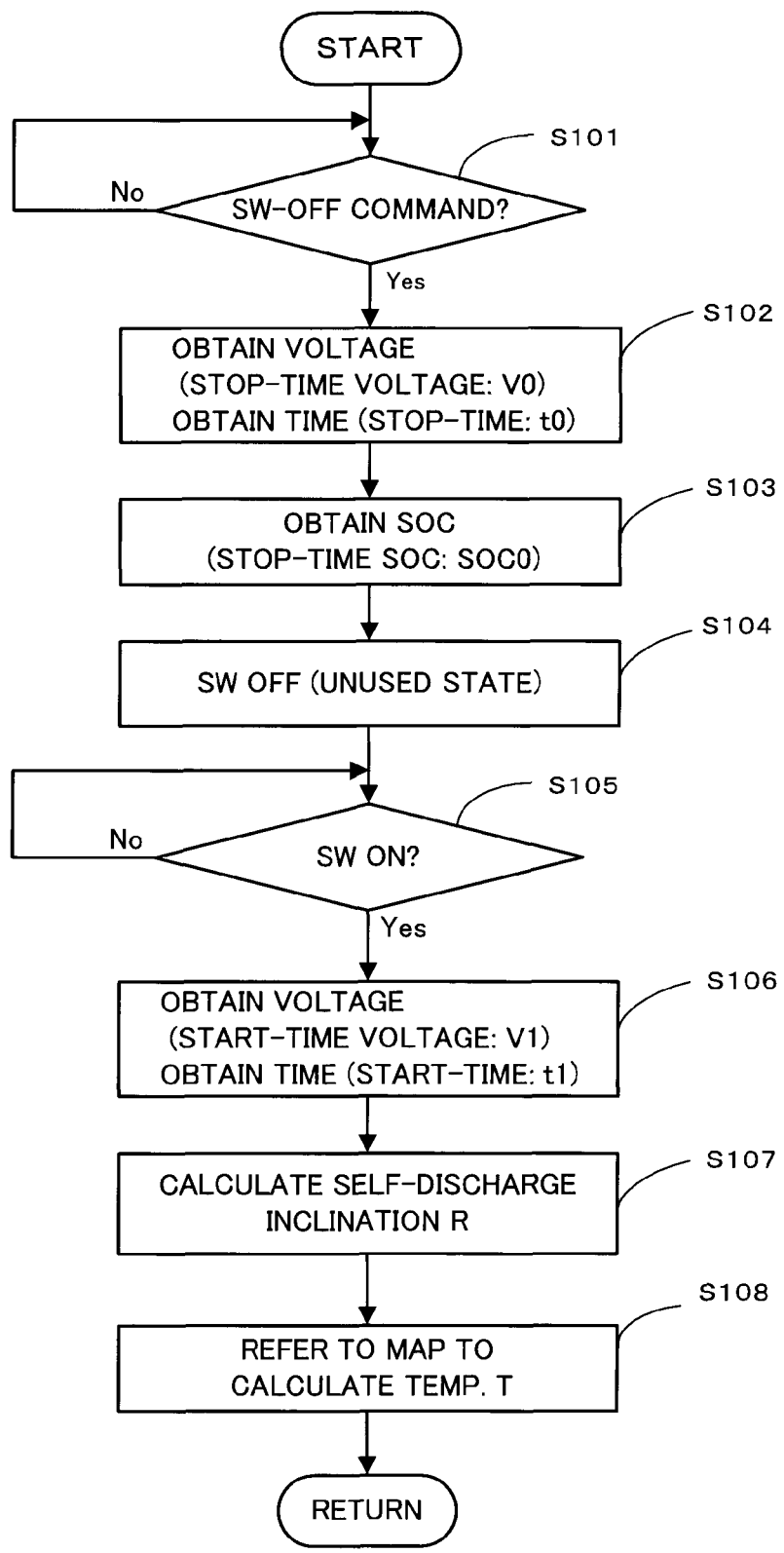
FIG. 5 is a flowchart showing temperature calculating process.

The aforementioned temperature determining process is explained below referring to a flowchart in FIG. 5. The temperature determining process shown in this flowchart is to calculate an average temperature during the unused period. A first half (S101-S104) of this process is executed when a user turns off a key and the controller 20 receives a command to turn a power source OFF but before completely stopping power supply to each section. This is the stop time. After that, a second half (S106-S108) of the process is executed when the controller 20 receives a command for start from the user. This is the start time.

In the present embodiment, upon receipt of a command for stop (S101: Yes), the stop-time state obtaining section 21 obtains a battery voltage and the clock time at that time. These are the stop-time voltage V0 and the stop time t0 (S102). Successively, a stop-time SOC (SOC0) which is an SOC of the battery at the stop time is obtained (S103). For instance, another map showing the relationship between the stop-time voltage V0 and the stop-time SOC (SOC0) may be further stored to allow the stop-time SOC to be read based on this map.

Furthermore, the controller 20 saves each value obtained in S102 and S103 (the stop-time voltage V0, the stop time t0, the stop-time SOC (SOC0)) and turns off the switch 13 (S104). This stops power supply. Thus, the vehicle is placed in a parking state and the battery 10 is brought in an unused state in which no charge and discharge is conducted. The controller 20 is also placed in a deactivated state. The operation up to this is the first half of the process.

When the user turns a starter key of a car for example to turn on the switch 13 (S105: Yes), electric power is supplied. This is the start time. Thus, the battery voltage and the clock time at the start time are obtained. These are the start-time voltage V1 and the start time t1 (S106). Further, the self-discharge slope R is calculated (S107) as shown by the equation (I) based on the stop-time voltage V0 and the stop time t0 obtained and saved in S102 in the first half and the start-time voltage V1 and the start time t1 obtained in S106.

Subsequently, the stop-time SOC (SOC0) and the self-discharge slope R calculated in S107 are applied to the self-discharge map 29 shown in FIG. 4, so that a corresponding temperature T can be obtained (S108). This temperature T is an average temperature during parking. The temperature calculating process is thus terminated. Various processes for vehicle running are subsequently performed.

Figure 6:
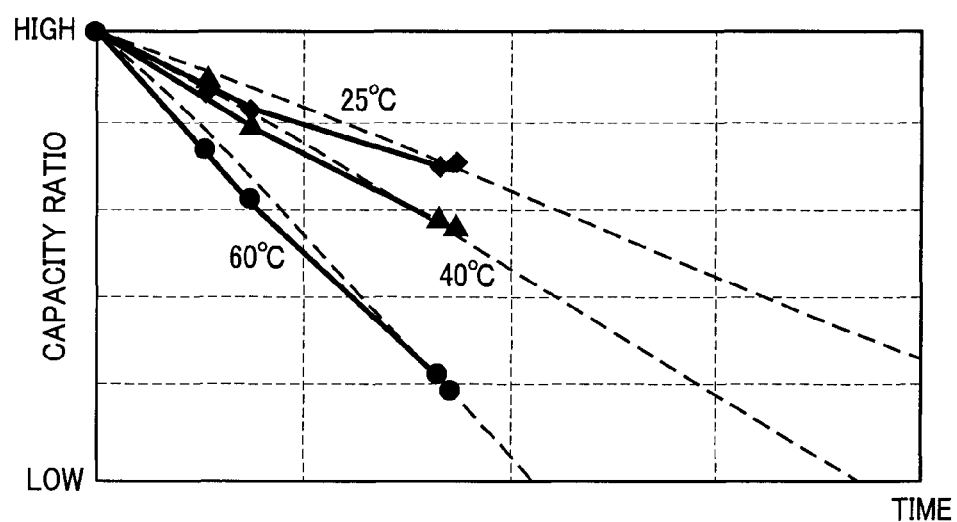
FIG. 6 is a graph showing a relationship between a degree of deterioration resulting from nonuse and temperature.

The deterioration degree calculating section 27 of the controller 20 in the present embodiment calculates the degree of deterioration progressed during the unused period based on the calculated temperature T obtained as above and the elapsed time Δt of the unused period. The progress degree of deterioration during the battery unused period greatly depends on the temperature T as shown in FIG. 6. This figure shows a ratio of capacity that decreases with time from a battery capacity of a new battery 10 under the condition that the battery 10 is left unused at each temperature. The capacity maintaining ratio in this figure is defined by a ratio of remaining battery capacity to a full battery capacity of the new battery 10. The capacity maintaining ratio decreases as the battery 10 deteriorates. As shown in this figure, as the temperature during the unused period is higher, the decreasing speed of the capacity maintaining ratio is faster.

According to the present embodiment, an average temperature T during the unused period can be determined. Accordingly, the deterioration degree calculating section 27 can accurately calculate the degree of deterioration progressed during the unused period based on FIG. 6 from the temperature T and the elapsed time Δt which is the duration of the unused period. On the other hand, the deterioration degree during running can be separately calculated based on the frequency and the degree of charge and discharge, the temperature in use, and others. The deterioration degree accumulating section 28 accumulates the deterioration degree during unused period and the deterioration degree during running and stores an accumulation result. The controller 20 in the present embodiment can thus calculate a battery capacity of the battery 10 at that time.

An alternative is to accumulate the deterioration degrees during the unused period, multiply an accumulation result by a coefficient previously determined based on the type of a vehicle, a user's condition, and others. This can also calculate the deterioration degree of the battery 10 during the whole period including running. For instance, it may store a coefficient map classified by the types of private car, company car, taxi, etc., the regions for use, and others. In this case, there is no need to separately calculate the deterioration degree during running.

Figure 7:
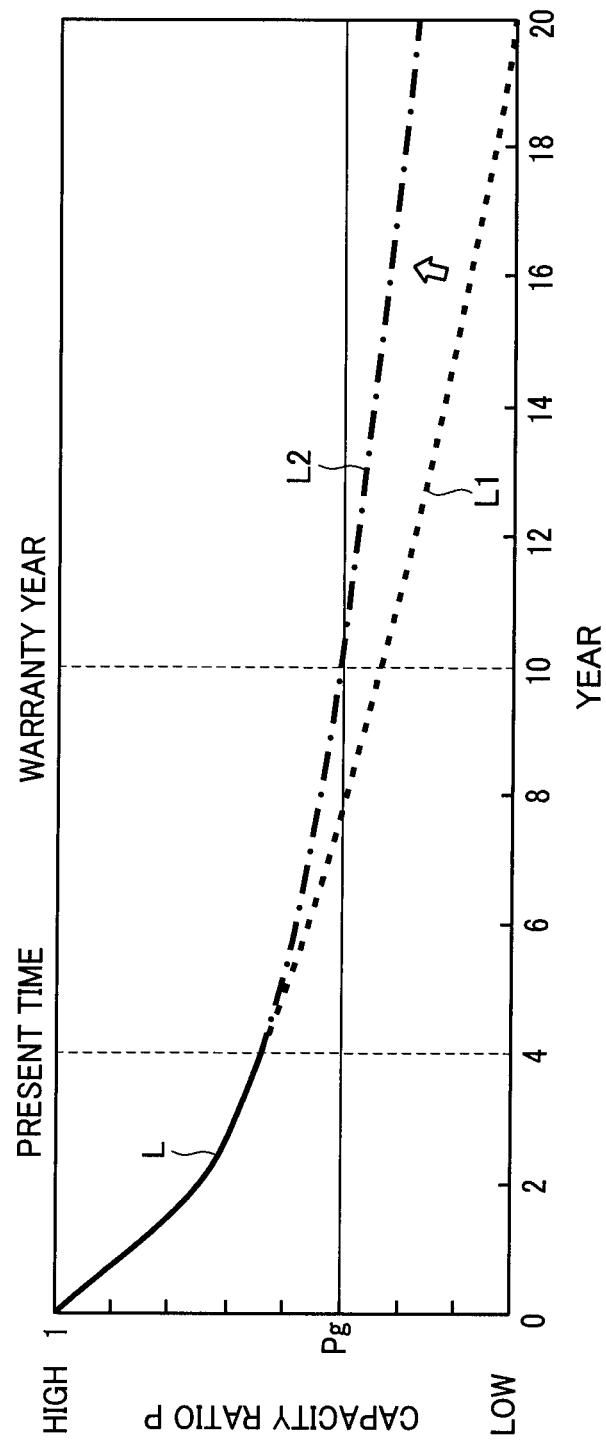
FIG. 7 is a graph showing estimated future degree of progress of deterioration.

In a car, generally, a warranty period of use or a warranted total travel distance is prescribed in advance. A battery is demanded to be usable without needing replacement with a new battery until either one of the above prescripts comes. Specifically, the battery capacity of the battery 10 gradually decreases as deteriorates as shown in FIG. 7 but it is demanded that a capacity maintaining ratio P does not fall below a warranted capacity maintaining ratio Pg previously determined before the warranty period of use or the warranted total travel distance is completed. This capacity maintaining ratio P is the same as shown in FIG. 6 and corresponds to a ratio of the remaining capacity to the full capacity of the battery 10.

FIG. 7 shows one example of a varying state of the capacity maintaining ratio P. In this car, a warranted capacity maintaining ratio Pg after ten years from purchase of a new car is determined. In the present embodiment, as mentioned above, the deterioration of the battery 10 can be accurately calculated. By accumulating that calculation results, it is possible to determine the progress degree of decrease in battery capacity up to this time (herein, four years). In the figure, a solid line L represents this progress degree in the form of variations in capacity maintaining ratio P.

As shown in FIG. 7, a future progress degree of deterioration can be estimated as a broken line L1 which is an extended line of the solid line L up to this time. In this example shown in the figure, the broken line L1 is not preferable because the ratio P falls below the warranted capacity maintaining ratio Pg before a lapse of a ten-year warranty period. In the case where it is estimated that the warranted capacity maintaining ratio Pg cannot be ensured as above, the subsequent usage of the battery 10 is somewhat limited for extension of life. A life extending process will be explained later. At several previously determined timings in the warranty period, it is preferable to determine whether or not this warranty can be maintained and decide subsequent usage based on the determination result.

The life extending process is explained below. In the present embodiment, when it is determined that the life extending process of the battery 10 is necessary, an upper limit of the SOC in an allowable usage range of the battery 10 in use is a little decreased. The progress speed of deterioration of the secondary battery in use is different according to its usage way. By decreasing the frequency to be charged fully, the progress of deterioration can be delayed. When it is determined that life extension is necessary, the SOC range allowing charge and discharge is limited to a little smaller range. In this way, even though the battery performance is somewhat restricted, a decreasing speed of the capacity maintaining ratio can be delayed.

In the above way, as indicated by a dashed-and-dotted line in FIG. 7, the deterioration progress can be delayed, thereby ensuring the warranted capacity maintaining ratio Pg for the warranty period of use. This makes it possible to fully use the possible battery performance and reliably ensure the warranted quantity for the warranty period. If the battery is used in such a state for a while and is estimated again that the warranted capacity maintaining ratio Pg for the warranty period cannot be ensured, the upper limit SOC is preferably further decreased. On the other hand, if it is determined that the upper limit SOC is too decreased, such restriction may be relaxed.

Figure 8:
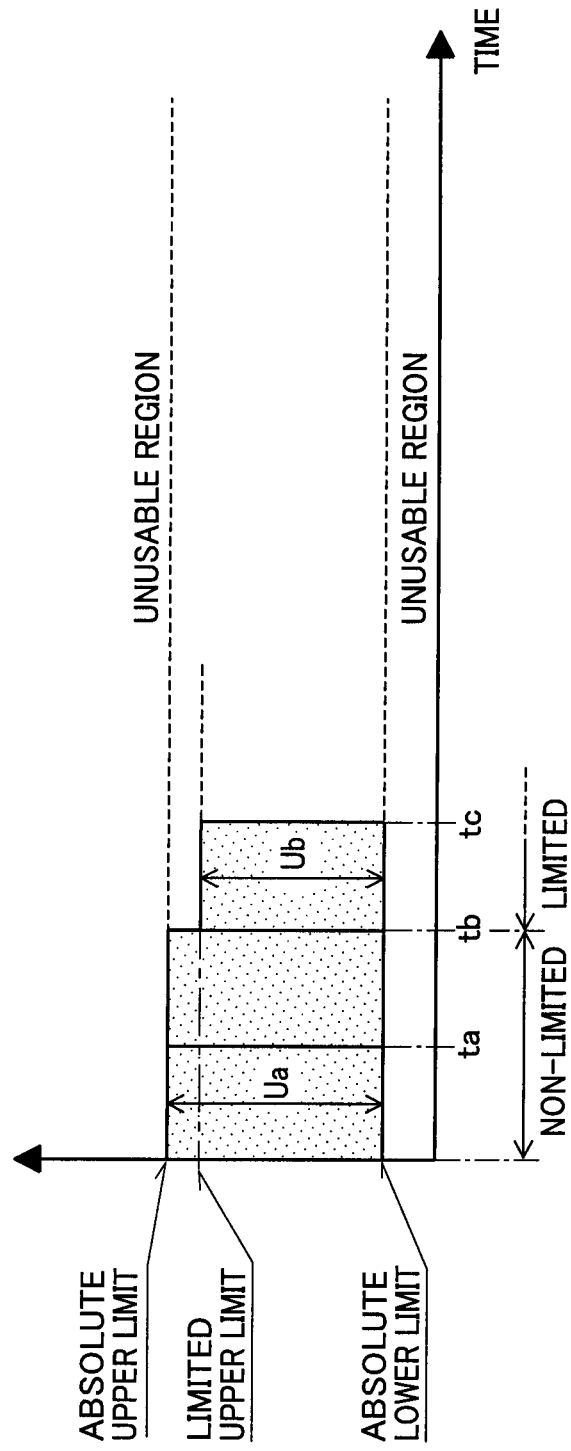
FIG. 8 is a graph showing an example of a range of SOC to be used.

For instance, as shown in FIG. 8, the battery 10 has upper and lower limits of a physically usable range as a battery (an absolute upper limit SOC and an absolute lower limit SOC). When the battery 10 is charged and discharged fully in the entire range in use, the battery performance can be obtained to the full but the deterioration progress is accelerated according to a usage situation. In the present embodiment, the battery 10 is charged and discharged in this full range Ua from a new battery state up to a predetermined determination timing ta. This range Ua is an original usage region of this battery 10.

At the determination timing ta, the progress degree of deterioration of the battery 10 is detected as above. As a result, the usage range is limited if the life extension is determined to be necessary. If not, the battery is used continuously in that usage range as shown in FIG. 8. At a next determination timing tb, the same determination is conducted. In this example in the figure, at the timing tb, the life extension is determined to be necessary. Accordingly, in a subsequent stage, the upper limit SOC permitted to be used is set at a slightly smaller restrictive upper limit SOC than the absolute upper limit SOC. The lower limit SOC is not needed to change. Thus, the range of the SOC permitted to be used is limited to the usage range Ub in the figure. The battery is further used within this range up to a determination timing tc. At this timing tc, the progress degree of deterioration is determined. Subsequently, it is preferable that the determination is appropriately performed and the upper limit SOC is changed based on a determination result.

As above, the upper limit SOC is set to be smaller than the absolute upper limit SOC, so that the battery 10 is prevented from deteriorating. This means that initially setting the upper limit SOC to a smaller value in a new battery can provide a longer life of the battery 10. In the battery 10 mounted in a vehicle and others, however, it is not always necessary to provide a longer life beyond its warranted period. Since restricting the upper limit SOC leads to suppression of output, excessive restriction is not preferable. Further, extreme extension of a life is not so advantageous. It is rather preferable to completely use the performance of the battery 10 within the warranty period. This may be an unnecessary restriction particularly to a user who often uses the battery in a situation where deterioration of the battery is slow. Further, not all vehicles are used up to the end of each warranty period.

In the present embodiment, the upper limit SOC is set smaller only when the capacity maintaining ratio P is estimated to fall below the warranted capacity maintaining ratio Pg. Accordingly, an accumulated EV running distance (i.e., a running distance by use of only an electric motor without using an engine) powered by the battery up to the end of the warranty period is longer than a EV running distance provided by a battery whose upper limit SOC is initially set small. For instance, a difference of about 10000 km for ten years may mathematically occur. Specifically, the present embodiment can fully use the battery 10 without waste.

Figure 9:
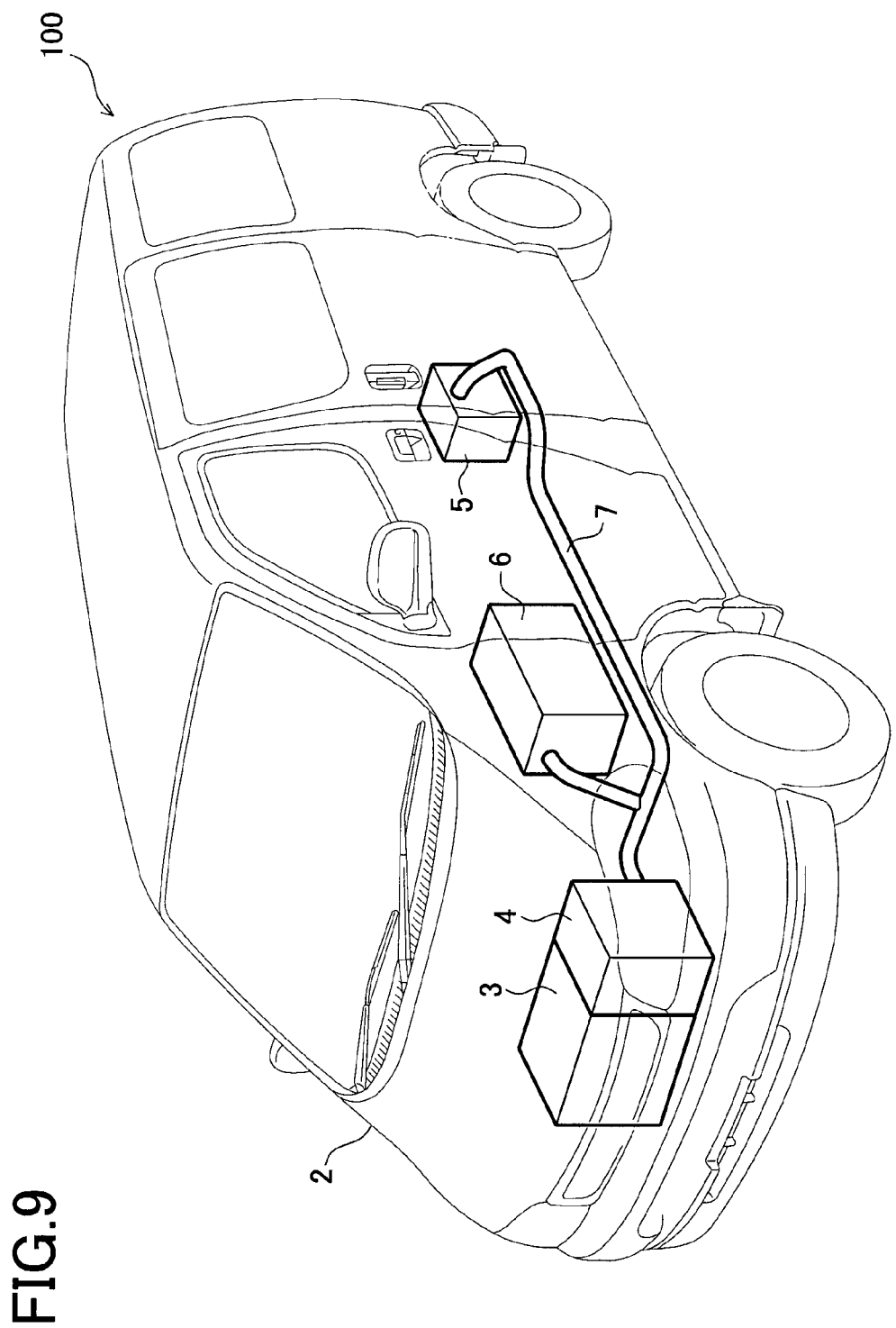
FIG. 9 is an explanatory view showing a vehicle equipped with the apparatus in the embodiment.

The secondary battery deterioration degree calculating apparatus 1 in the present embodiment can be mounted in a hybrid vehicle or another vehicle. FIG. 9 shows a hybrid vehicle 100 equipped with the calculating apparatus 1 in the present embodiment. This hybrid vehicle 100 is provided, in a vehicle body 2, with an engine 3, an electric motor 4, a battery pack 5, and a controller 6. The battery pack 5, the electric motor 4, and the controller 6 are connected to each other through a cable 7. The battery pack 5 contains a plurality of the batteries 10. The controller 6 includes the controller 20 in the present embodiment.

The hybrid vehicle 100 drives wheels by a combination of the engine 3 and the electric motor 4. In the hybrid vehicle 100 in the present embodiment, a discharge current of the batteries is supplied from the battery pack 5 to the electric motor 4. The electric motor 4 thus generates power. According to a running condition of the hybrid vehicle 100, the electric motor 4 may generate regenerative electromotive force. Thus, a charge current is supplied to the batteries of the battery pack 5 to charge the batteries. Herein, the controller 6 controls exchanging of currents between the battery pack 5 and the electric motor 4. In other words, the controller 6 not only has the function of the controller 20 but also contains the inverter 15.

The vehicle in the present embodiment may be any vehicle using electric energy of the battery in the whole or part of its power source and is not limited to the hybrid vehicle. For instance, the vehicle may be an electric vehicle, a plug-in hybrid vehicle, a hybrid railroad vehicle, a forklift, an electric-driven wheel chair, an electric bicycle, an electric scooter, etc.

As explained in detail above, according to the secondary battery deterioration degree calculating apparatus 1 in the present embodiment, the self-discharge slope R and the stop-time SOC are applied to the self-discharge map 29. Accordingly, an average temperature during the unused period can be determined. This self-discharge slope R can be obtained by dividing a difference between the stop-time voltage and the start-time voltage by an elapsed time. No process is performed during the unused period, so that electric power is not continuously consumed. At the same time, the deterioration degree during the unused period can be calculated with high accuracy. Consequently, a remaining life of the battery 10 can be accurately calculated as well as calculation of the deterioration degree during running. Further, the life extending process is performed only when it is determined that the deterioration degree of a battery up to the end of the warranty period is large. The secondary battery deterioration degree calculating apparatus 1 is therefore able to greatly bring out the performance of the battery 10.

The above embodiment is merely an example and gives no limitation to the present invention. Thus, the present invention may be embodied in other specific forms without departing from the essential characteristics thereof. For instance, the above embodiment uses the stop-time SOC to calculate temperature. Alternatively, the stop-time SOC may be replaced by the start-time SOC. In this case, the stop-time state obtaining section 21 obtains only the voltage of the battery 10 at the stop time and the start-time state obtaining section 22 obtains both the voltage and the SOC of the voltage 10 at the start time.

In the case where the unused period is very short, on the other hand, the process of determining the temperature in the above embodiment is not always necessary. For instance, when the unused period is less than 1 hour, a measured temperature of the outer case measured just before the stop time may be adopted.

As another example, it may be arranged such that the degree of variation of the capacity maintaining ratio P from a new battery state is detected as a deterioration slope and its warranty value is determined in advance. For instance, in the case where the deterioration slope becomes larger than more than +10% of its warranty value, the upper limit SOC may be decreased by a range of 5% to 10% (preferably 10%). If the deterioration slope is equal to or less than +10% of the warranty value, the upper limit SOC may be maintained at the same value as a previous value. In this way, the capacity maintaining ratio P at a late stage of the warranty period can be maintained.

Reference Signs List
1 Secondary battery deterioration degree calculating apparatus
10 Secondary battery
20 Controller
21 Stop-time state obtaining section
22 Start-time state obtaining section
23 Time obtaining section
24 Self-discharge slope obtaining section
26 Temperature determining section
27 Deterioration degree calculating section
28 Deterioration degree accumulating section 29 Self-discharge map
100 Hybrid vehicle

The invention claimed is:

1. A secondary battery deterioration degree calculating apparatus comprising:
 a stop-time voltage obtaining section for obtaining a voltage value at a point of time when charge and discharge of a target secondary battery is terminated;
 a start-time voltage obtaining section for obtaining a voltage value at a point of time when charge and discharge of the target secondary battery is started for the first time after the stop-time voltage obtaining section obtains data;
 an SOC obtaining section for obtaining an SOC of the target secondary battery at a stop time or at a start time;
 a time obtaining section for obtaining an elapsed time, the elapsed time being a length of time of an unused period, the unused period being from when the stop-time voltage obtaining section obtains the data to when the start-time voltage obtaining section obtains data;
 a self-discharge slope obtaining section for obtaining a self-discharge slope of the target secondary battery by dividing an absolute value of a difference between the start-time voltage value obtained by the start-time voltage obtaining section and the stop-time voltage value obtained by the stop-time voltage obtaining section by the elapsed time obtained by the time obtaining section;
 a self-discharge map in which a relationship between an SOC and the self-discharge slope in the target secondary battery is recorded for each temperature;
 a temperature determining section for obtaining a temperature from the self-discharge slope obtained by the self-discharge slope obtaining section, the SOC obtained by the SOC obtaining section, and the self-discharge map;
 a deterioration degree calculating section for calculating a progress degree of deterioration of the target secondary battery during the unused period based on the temperature obtained by the temperature determining section and the elapsed time obtained by the time obtaining section; and
 a deterioration degree accumulating section for accumulating the progress degree of deterioration calculated by the deterioration degree calculating section.

2. A deterioration degree calculating method for a secondary battery, the method comprising the steps of:
 obtaining a voltage value at a stop time, the stop time being a point of time when charge and discharge of a target secondary battery is terminated;
 obtaining a voltage value at a start time, the start time being a point of time when the charge and discharge of the target secondary battery is started for a first time after the voltage value at the stop time is obtained;
 obtaining an SOC of the target secondary battery at the stop time or at the start time;
 obtaining an elapsed time, the elapsed time being a length of time from the stop time to the start time;
 obtaining a self-discharge slope of the target secondary battery by dividing an absolute value of a difference between the voltage value obtained at the start time and the voltage value obtained at the stop time by the obtained elapsed time;
 obtaining a temperature from the obtained self-discharge slope, the obtained SOC, and the self-discharge map by use of the self-discharge map in which a relationship between an SOC and a self-discharge slope in the target secondary battery is recorded for each temperature;
 calculating a progress degree of deterioration of the target secondary battery during an unused period based on the obtained temperature and the obtained elapsed time; and
 accumulating the calculated progress degree of deterioration.

* * * * *